United States Patent [19]

Colin et al.

[11] 4,454,468

[45] Jun. 12, 1984

[54] SWITCHING DEVICE FOR THE ELECTRICAL MEASUREMENT OF REACTIVE IMPEDANCES AND A MEASURING BRIDGE USING SUCH A SWITCHING DEVICE

[75] Inventors: Gérard Colin; Hervé Reamot, both of Bagnolet, France

[73] Assignee: L.C.C.-C.I.C.E. Compagnie Europeenne de Composants Electroniques, Bagnolet, France

[21] Appl. No.: 370,129

[22] Filed: Apr. 20, 1982

[30] Foreign Application Priority Data

Apr. 21, 1981 [FR] France .................... 81 07913

[51] Int. Cl.³ ............................................. H03H 1/00
[52] U.S. Cl. .................................. 323/365; 324/60 C; 324/DIG. 1
[58] Field of Search .......................... 323/209–211, 323/218, 219, 293, 352, 364–365, 370; 324/57 R, 60 R, 60 C, DIG. 1

[56] References Cited

U.S. PATENT DOCUMENTS

| 2,430,488 | 11/1947 | Wilhelm | 323/365 |
|---|---|---|---|
| 3,036,263 | 5/1962 | Hallas | 323/365 X |
| 3,235,792 | 2/1966 | Revesz et al. | 323/365 X |
| 3,955,134 | 5/1976 | Woodford | 323/210 |

FOREIGN PATENT DOCUMENTS 324459 9/1957 Switzerland .
907011 9/1962 United Kingdom .

OTHER PUBLICATIONS

Soviet Instrumentation and Control Journal (a cover to cover translation of the Russian original journal: Pribory i sistemy Upravloniya) Russian No. 3, Mar. 1971 by: A. A. Kukhlonkov et al., "The MTsE-9A Digital Measuring Instrument", pp. 58–61.

Primary Examiner—Peter S. Wong
Attorney, Agent, or Firm—Oblon, Fisher, Spivak, McClelland & Maier

[57] ABSTRACT

A switching device is provided, for measuring capacities, comprising n branches in parallel with $n \geq 1$, each branch being formed by a capacity to be measured and a switch, the assembly of switches being subjected to a control signal which successively connects each capacity in parallel across the measuring bridge. Each switch may assume two positions, one of the positions connecting electrically the first plate of the capacitor to be measured to one of the ends of the measuring bridge, the other position connecting electrically the first plate to the second one and to the other end of said measuring bridge.

4 Claims, 2 Drawing Figures

SWITCHING DEVICE FOR THE ELECTRICAL MEASUREMENT OF REACTIVE IMPEDANCES AND A MEASURING BRIDGE USING SUCH A SWITCHING DEVICE

BACKGROUND OF THE INVENTION

The present invention relates to a switching device for the electrical measurement of reactive impedances, comprising n branches in parallel with $n \geq 1$, each branch being formed from a reactive impedance to be measured and a switch. The assembly of switches being subjected to a control signal which successively connects each reactive impedance in parallel across the measuring bridge.

This type of switching device is generally controlled by an electrical signal. It is then designated by the name "electronic switch". An electronic switch allows the measurement of n components in a minimum time without mechanical transfer. Generally, this type of switching device is used for measuring reactive impedances. By reactive impedance is meant a circuit formed either by one or more capacities, or one or more inductances or by a combination of the two, said circuit possibly comprising resistive elements. This measurement is made by means of a measuring bridge of the WIEN or NERNST type. The measurement takes place at different frequencies depending on the type of impedance to be measured. For further details, reference may be made for example to the article entitled "Mesure sur condensateurs" by C. LECLECQ, published by the central laboratory of electrical industries.

In each branch, the switch has two positions; the closed position which electrically connects the first plate of the capacitor to the first end of the measuring bridge, the second plate of the capacitor being connected electrically to the second end of the measuring bridge and the open position, in which the electrical contact beween the first plate and the first end of the bridge is open. Switching over from one position to the other is caused by an electrical signal of a frequency of the order of 5 Hz, which successively closes each branch so that a single switch is closed and the others open.

The ideal switching device has the following characteristics: a zero resistance when closed, infinite resistance when open and infinitely short switching times. For the switches, REED change-over relays are usually used, having a capacity between contacts less than 1.5 pF, which is closest to these characteristics and as measuring bridge, an automatic RLC measuring bridge, well known to those skilled in the art.

However, the capacities between the contacts of the switch introduce parasite capacities disturbing the measurement. This disadvantage is common to all switches and it does not apply especially to REED change-over relays. In fact, when the switch is open, a parasite capacity between the two contacts of the switch is established in series with the capacity to be measured in the branch considered. The capacity of the switch then takes on the equivalent value:

equivalent $C = [(C_x \cdot C_p)/(C_x + C_p)] \times n$ in which $C_x$ is the capacity to be measured, $C_p$ is the parasite capacity between contacts and n is the branch number. The equivalent capacity of the switching device thus introduced may assume values comparable to the capacities which are to be measured. The equivalent capacity varies as a function of the number and of the value of the components to be measured. In addition, the value of the equivalent capacity varies at each switch-over, each of the branches not having exactly the same characteristics. Furthermore, all the branches of the switching device are not necessarily used during a measurement. In this case, the parasite capacity of each non used branch is not taken into account for the measurement. From which it follows that it is impossible to measure low value capacities accurately without having to make a correction. Using a correction consisting in balancing the measuring bridge before each measuring cycle has already been proposed. However, this means that the advantage of the speed of electronic switching is lost. The resetting of a bridge to zero takes time during which the switching device could effect several measurements.

Use of a computer for automatically subtracting the parasite capacity has also been proposed. However, this computer is not easy to handle, is space-consuming and considerably increases the cost price of the switching device. In addition, in the case where all the branches are not used, it is necessary to inform the computer thereof so that it effects the adequate correction.

Consequently, there does not exist at the present time a low price switching device retaining electronic switching speed.

SUMMARY OF THE INVENTION

The switching device of the invention does not have the disadvantages of the above-described systems and allows measurement with constant parasite capacities whatever the number of branches used in the switching device. For this, each switch may assume two postions, one of the positions connecting electrically the first plate of the capacitor to be measured to one of the ends of the measuring bridge, the other position connecting electrically the first plate to the second plate which is connected to the other end of the measuring bridge. Each switch has thus three contacts: a contact connected electrically to the first end of the measuring bridge which will be called contact C or work contact, a contact connected electrically to the first plate of the capacitor which will be called contact B, a contact connected electrically to the second end of the measuring bridge and to the second plate of the capacitor which will be called contact A or rest contact. In the case of the second position, with the capacity to be measured being short-circuited, i.e. the first plate is connected electrically to the second plate, said capacity is not taken into account in the measurement effected by the measuring bridge. In the case of the first position considered, the capacity to be measured is connected across the measuring bridge.

In operation, a single switch occupies the first position, all the others having the second position. The capacity measurement takes place in the branch where the switch has the first position: the capacity to be measured in this branch will be named in the rest of the description "Measured capacity". In the case of the second position, a parasite capacity will be established between contact C and contact B. This capacity will thus be in parallel across the measured capacity. In the case of the first position considered, a parasite capacity will be established between contact A and contact B. This capacity will also be in parallel across the measured capacity. During switching, the parasite capacity of one position disappears but it is compensated for by the parasite capacity of the other position whose value is substantially identical. The equivalent capacity of the switching device remains then constant whatever the value and the number of the capacities to be measured. Each switching device has its own parasite capacity whose value depends on the number of branches forming it:

equivalent $C = C_p \times n$ in which $C_p$ is the parasite capacity, n is the number of branches of the switching device. Balancing of the bridge takes place then before use of the switching device for several series of measurement, across this fixed equivalent parasite capacity.

The switching device of the invention has the advantage of occupying little space since it may be formed on a printed circuit. It is simple to handle. Moreover, it may be used without previous adjustment for several series of measurement with capacities of different values. Finally, it is possible not to use all the branches without any modification of the adjustment.

As switches in the present invention there will be preferably used change-over REED relays with a capacity between contacts less than 1.5 pF.

According to a preferred embodiment, the switching device of the invention is characterized in that adjustable capacitors are disposed in parallel across at least one of the positions of the switch.

In fact, the junctions between the different elements may introduce parasite capacities of lesser importance than the parasite contact capacities. In particular, the junctions between the capacities to be measured and the switching device introduce parasite junction capacities. These parasite junction capacities are small in value, typically a few hundredths or a few tenths of a pico Farad. They may upset the measurement for capacities to be measured whose order of size is a few tens of pico Farad. These parasite junction capacities are then in series with the capacity to be measured and each branch of the switching device has its own parasite junction capacity. With adjustable capacities placed between contacts A,B and B,C, each of the parasite junction capacities can be adjusted equal to a fixed value. The adjustment takes place for several series of measurement.

BRIEF DESCRIPTION OF THE DRAWINGS

The present invention will be better understood from the following description given by way of non limiting example with reference to the figures which show.

DESCRIPTION OF THE PREFERRED EMBODIMENT

Figure 1:
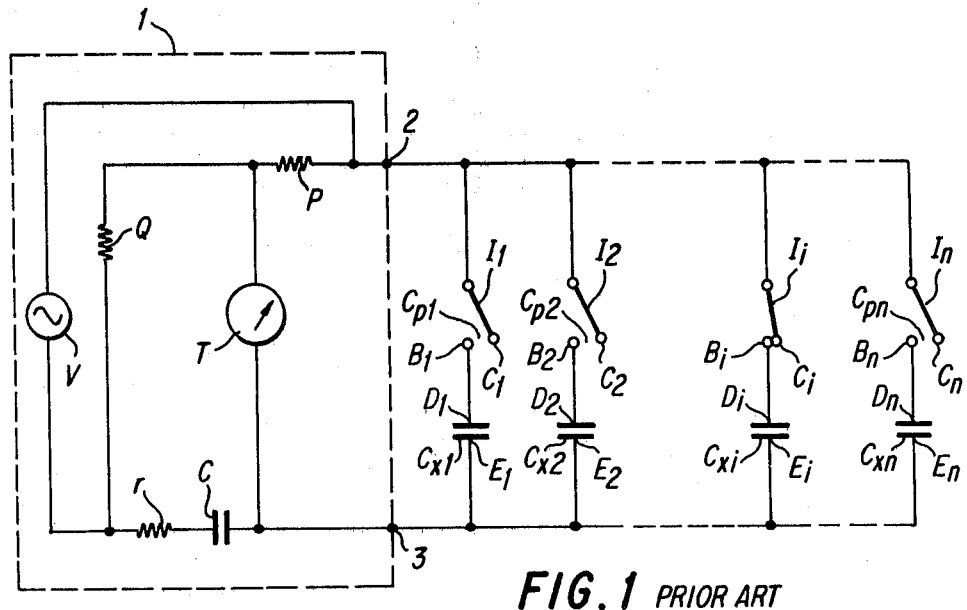
FIG. 1, the switching device of the prior art,
FIG. 2, the switching device of the present invention.

In FIG. 1, the measuring device (1) is connected at (2) to contacts $C_1, C_2, \ldots, C_n$ of switches $I_1, \ldots, I_n$. The contacts $B_1, B_2 \ldots, B_n$ are connected respectively to the first plates $D_1, D_2, \ldots, D_n$ of capacitors $C_{x1} \ldots C_{xn}$, whose second plates $E_1, E_2, \ldots E_n$ are connected to the second end (3) of the measuring bridge (1). The branch comprising switch $I_i$ in series with capacity $C_{xi}$ is the closed circuit where the measurement takes place. In all the other branches, the switch is in the open position. The elements of the measuring bridge (1) are shown schematically in the form of a WIEN bridge comprising the elements:

P which is a balancing resistor for the measuring bridge,
Q which is a balancing resistor for the measuring bridge,
r which is an adjustable resistor,
C which is an adjustable capacity,
T which is a galvanometer,
V which is an AC generator.

In operation, when the measurement of capacity $C_{xi}$ is finished, the switch of the branch where this measurement took place opens and the switch of the next branch closes so as to effect measurement of the capacity to be measured in this latter branch. Switching over is caused by an electric signal of a frequency of the order of 5 Hz. This signal closes successively each branch so that a single switch is closed and the others are open.

In all the branches where the switch is open, a parasite capacity is established between the contacts of type $(B_1 \ldots B_{i-1}, B_{i+1} \ldots B_n)$ and respectively the contacts of type $(C_1 \ldots C_{i-1}, C_{i+1} \ldots C_n)$, these parasite capacities are shown by $C_{p1} \ldots C_{pi-1}, C_{pi+1} \ldots C_{pn}$. In each of the open branches, there is then established a parasite capacity in series with the capacity to be measured of the branch considered. The switching device may then amount, from the capacitive point of view, to two capacities in parallel: the capacity to be measured of the closed branch and the equivalent capacity formed by the sum of the capacities of the open branches, each of the capacities of the open branches being formed by the parasite capacity of said branch in series with its capacity to be measured. This equivalent capacity of the switching device may assume values comparable to the capacities which it is desired to measure. The equivalent capacity (see above formula) varies for each series of measurements and for each switching, which poses problems of rebalancing the measuring bridge. These problems cannot be resolved without a time-consuming and not very easily accomplished correction. In practice, the equivalent parasite capacity is of the order of 20 pF. If an accuracy of 2% is desired, capacities lower than 1000 pF cannot be measured.

Figure 2:
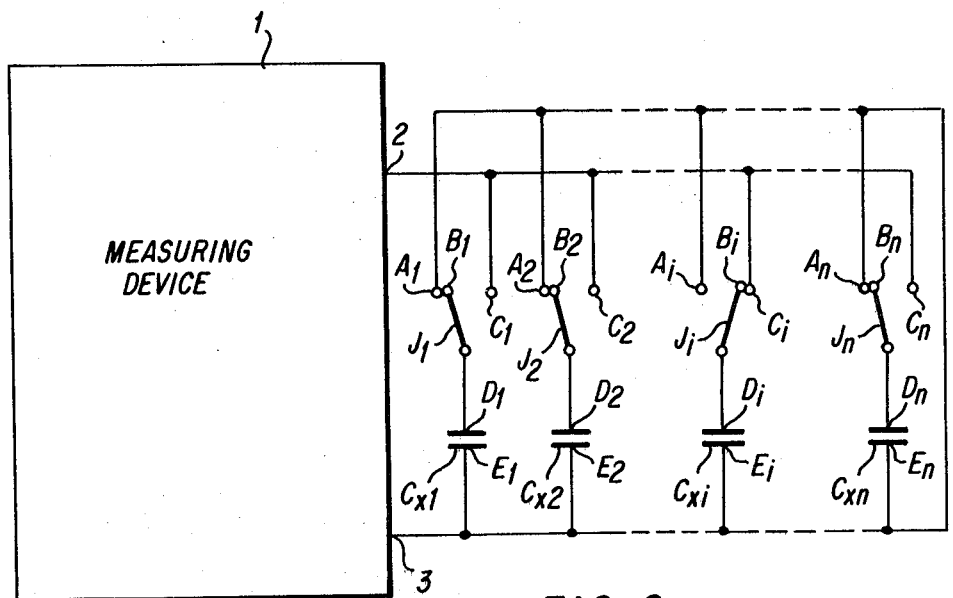

In FIG. 2 is shown the switching device of the invention. In this figure, the same elements as those in FIG. 1 bear the same reference numbers. These switches are shown at $J_1 \ldots J_n$. The contact points $A_1 \ldots A_n$ of switches $J_1 \ldots J_n$ are connected electrically to the second plate of the respective capacitors $(C_{x1} \ldots C_{xn})$ and to the second end (3) of the measuring bridge (1). The contact points $B_1 \ldots B_n$ respectively of switches $(J_1 \ldots J_n)$ are conneced electrically to the first plate of the respective capacitors $(C_{x1} \ldots C_{xn})$. The contact points $C_1 \ldots C_n$ respectively of switches $(J_1 \ldots J_n)$ are connected electrically to the first end (2) of the measuring bridge (1). Each switch $(J_1 \ldots J_n)$ may then assume two positions. In the first position the contacts of type $(B_1 \ldots B_n)$ are in electrical connection, respectively with the contact points of type $(C_1 \ldots C_n)$. In the second position, the contact points of type $(B_1 \ldots B_n)$ are in electrical connection respectively with the contact points of type $(A_1 \ldots A_n)$.

In operation, the first position is the position for measuring the corresponding capacity to be measured whereas the second position is a waiting position for measurement of the corresponding capacity to be measured which is short-circuited, i.e. its first plate is connected to its second plate. Said capacity plays then no part in the measurement effected by the measuring bridge (1). When the measurement of a capacity to be measured is finished, the corresponding switch goes over from position 1 to position 2. The switch of the next branch then goes over from position 2 to position 1 so as to effect measurement of the capacity of the next branch. The switching over is caused by an electrical signal of a frequency of the order of 5 Hz. This signal switches over successively the switches from position 1 to position 2 so that a single switch is in the measuring position, the others being in a waiting position. In FIG. 2, the switches ($J_1 \ldots J_{i-1}, J_{i+1} \ldots J_n$) are in position 2 whereas switch $J_i$ is in position 1.

In the case of the position 2, the parasite capacity is then established between the contact points of type ($B_1 \ldots B_n$) and respectively the contact points of type ($C_1 \ldots C_n$). This parasite capacity is in parallel across the corresponding capacity to be measured as well, moreover, as across the parasite capacities of the other branches. In the case of position 1, the parasite capacity is established between the contact points of type ($B_1 \ldots B_n$) and respectively the contact points of type ($A_1 \ldots A_n$). This parasite capacity is in parallel across the corresponding capacity to be measured as well as across the parasite capacities of the other branches. For the same switch, the parasite capacities existing in the two positions are substantially equal in value.

The equivalent parasite capacity of the switching device is independent then of the values of the capacities to be measured and independent of the number of capacities to be measured. It only depends on the characteristics of the switching device: the number of branches which this latter has and the values of the parasite contact capacities of each of the switches (see above formula).

Balancing of the measuring bridge (1) takes place then before use of the switching device for several series of measurement across the fixed equivalent capacity. Capacities of the order of a few pico Farads may be accurately measured. In practice, the invention allows capacities of the order of 10 pF to be measured with an accuracy of 2%.

What is claimed is:

1. A reactive impedance measuring device comprising:
    a measuring bridge having first and second ends and a plurality of branches in parallel,
    each branch including a reactive impedance to be measured having a first end electrically connected to said first end of said measuring bridge and further including a switch, said switch in each branch controlled by a signal for successively connecting each reactive impedance in parallel across said ends of said measuring bridge,
    each of said switch having a measuring position for electrically connecting a second end of said reactive impedance to said second end of the measuring bridge, and a rest position for short-circuiting both ends of said reactive impedance,
    whereby during measurement of a selected reactive impedance, all other reactive impedance are short-circuited.

2. A reactive impedance measuring bridge as claimed in claim 1, wherein:
    said reactive impedance is a capacitance.

3. A reactive impedance measuring bridge as claimed in claim 1, wherein:
    said switches are REED change-over relays.

4. A reactive impedance measuring bridge as claimed in claim 1, wherein:
    said plurality of branches includes between 10 and 40 branches.

* * * * *